(12) United States Patent
Kil et al.

(10) Patent No.: US 9,831,085 B2
(45) Date of Patent: Nov. 28, 2017

(54) METHOD OF FABRICATING HAFNIUM OXIDE LAYER AND SEMICONDUCTOR DEVICE HAVING THE SAME

(71) Applicant: SK hynix Inc., Gyeonggi-do (KR)

(72) Inventors: Deok Sin Kil, Seoul (KR); Jae Sung Roh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/200,780

(22) Filed: Jul. 1, 2016

(65) Prior Publication Data
US 2017/0004967 A1 Jan. 5, 2017

(30) Foreign Application Priority Data
Jul. 1, 2015 (KR) .................. 10-2015-0094397

(51) Int. Cl.
H01L 21/02 (2006.01)
C23C 16/02 (2006.01)
C23C 16/40 (2006.01)
C23C 16/455 (2006.01)
C23C 16/56 (2006.01)

(52) U.S. Cl.
CPC .... *H01L 21/02362* (2013.01); *C23C 16/0272* (2013.01); *C23C 16/405* (2013.01); *C23C 16/45525* (2013.01); *C23C 16/56* (2013.01); *H01L 21/0228* (2013.01); *H01L 21/02181* (2013.01); *H01L 21/02356* (2013.01)

(58) Field of Classification Search
USPC ........................................................ 438/591
See application file for complete search history.

(56) References Cited

U.S. PATENT DOCUMENTS

| 6,785,120 B1 | 8/2004 | Basceri et al. |
| 8,901,706 B2 | 12/2014 | Chudzik et al. |
| 2007/0048915 A1 | 3/2007 | Ting |
| 2008/0164582 A1 | 7/2008 | Govindarajan |
| 2011/0024875 A1* | 2/2011 | Takebayashi ........... C23C 16/40 257/532 |
| 2013/0175665 A1 | 7/2013 | Chudzik et al. |

OTHER PUBLICATIONS

Chiung-Wei Lin1,2 and Yi-Tsung Chiang2, Tetragonal hafnium oxide film prepared by low-temperature oxidation, Oct. 6, 2014, Japanese Jopurnal of Applied Physics.*

* cited by examiner

*Primary Examiner* — Marcos D Pizarro
*Assistant Examiner* — Lawrence Tynes, Jr.
(74) *Attorney, Agent, or Firm* — IP & T Group LLP

(57) ABSTRACT

Provided are a method of fabricating a hafnium oxide layer and a method of fabricating a semiconductor device using the same. The method of fabricating a tetragonal hafnium oxide layer includes providing a substrate and then forming an initial hafnium oxide layer on the substrate. The initial hafnium oxide layer may have an amorphous structure, a monoclinic crystal structure, or a mixed structure thereof on the substrate. Phase-changing the initial hafnium oxide layer to a tetragonal hafnium oxide layer by heating the initial hafnium oxide layer at a temperature equal to or higher than a phase change temperature to the tetragonal hafnium oxide layer, is performed. Then, the heated tetragonal hafnium oxide layer may be rapidly cooled to suppress nucleation and growth of a monoclinic hafnium oxide in the tetragonal hafnium oxide layer.

24 Claims, 10 Drawing Sheets

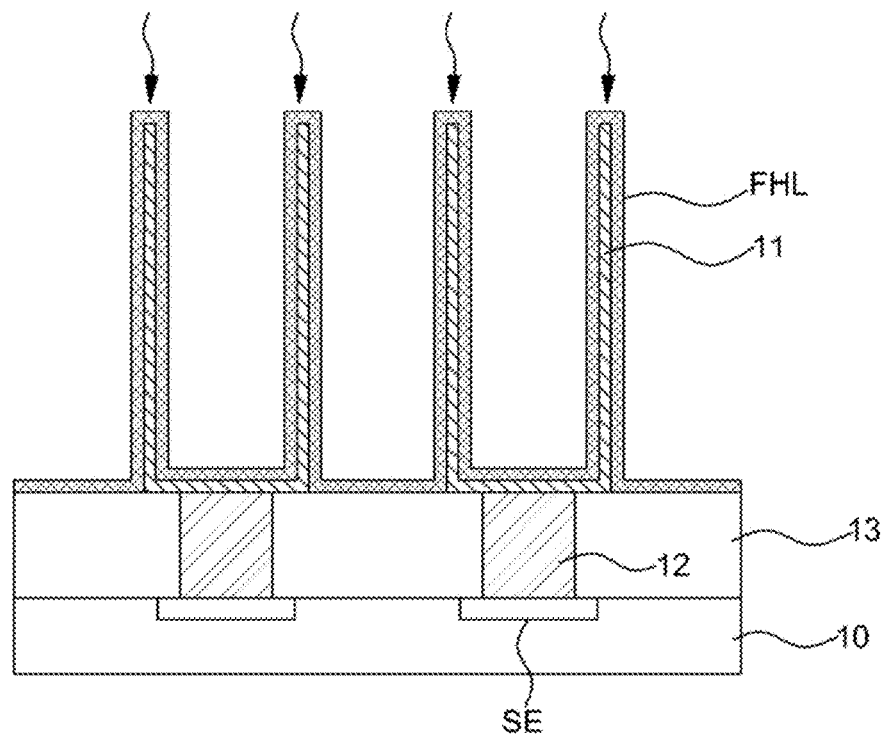

METHOD OF FABRICATING HAFNIUM OXIDE LAYER AND SEMICONDUCTOR DEVICE HAVING THE SAME

CROSS-REFERENCES TO RELATED APPLICATION

The present application claims priority under 35 U.S.C. 119(a) to Korean application number 10-2015-0094397, filed on Jul. 1, 2015, which is herein incorporated by reference in its entirety.

BACKGROUND OF THE INVENTION

1. Field of the Invention

The present invention relates to a technique for fabricating a semiconductor, and more particularly, to a method of fabricating a hafnium oxide layer and a semiconductor device having the same.

2. Description of the Related Art

Based on recent development of technologies related to semiconductor fabrication processes, downscaling of large scale integrated circuits (LSIs) is being accelerated. Particularly, in the field of a memory device, a design rule narrows down continuously, and a memory cell size smaller than or equal to 30 nm is demanded.

In a dynamic random access memory (DRAM), which is one of the most representative semiconductor devices, an area occupied by a capacitor, which is one of basic elements of a memory cell, is being gradually reduced. However, even if an area occupied by a capacitor is reduced, it is necessary to maintain a predetermined capacitance to secure a memory operational margin. Various techniques therefor have been suggested. For example, an approach for reducing a thickness of a dielectric layer may be available to secure a proper capacitance. However, in this case, a leakage current may increase due to a reduced physical thickness of the dielectric layer. To reduce such a leakage current, a technique is intensively investigated which replaces a conventional dielectric of silicon oxide with a high-k material. Due to a large band gap it has, a high-k material with a given thickness may be equivalent to an oxide with a much smaller thickness in terms of leakage current.

Another example of applications of high-k materials related to the down-scaling may be a gate insulation layer. To meet the trend of reduction of a gate width and operation voltage, a high-k material may be an alternative to silicon oxide for a gate insulation layer.

The high-k materials include a single layer structure, such as a hafnium oxide ($HfO_2$) layer, a zirconium oxide ($ZrO_2$) layer, and a $SrTiO_3$ layer, or a stack layer, such as a $ZrO_2/Al_2O_3/ZrO_2$. From the above-listed materials, the hafnium oxide is equivalent to oxide with a thickness below 4 Å and is suitable to meet a design rule less than or equal to 20 nm. Thus, hafnium oxide is one of most prominent candidate materials for a next-generation DRAM capacitor.

The hafnium oxide exhibits greater dielectric permittivity (k), for example, equal to or higher than 60, and wider energy band gap when the hafnium oxide has a tetragonal crystal structure than when the hafnium oxide has a monoclinic crystal structure. Therefore, it is preferable to apply a hafnium oxide having the tetragonal crystal structure to a new DRAM capacitor or gate insulator. However, since the hafnium oxide is thermodynamically stable in a monoclinic crystal structure at room temperature, a tetragonal crystal structure is easily changed to a monoclinic crystal structure. Thus, it is difficult to actually obtain a hafnium oxide having the tetragonal crystal structure.

SUMMARY OF THE INVENTION

The present invention provides a method of fabricating a tetragonal hafnium oxide layer.

The present invention also provides a method of fabricating a semiconductor device using a high dielectric permittivity and a wide energy band gap of the tetragonal hafnium oxide layer.

According to an aspect of the present invention, the method may include forming an initial hafnium oxide layer over a substrate, wherein the initial hafnium oxide layer has an amorphous structure, a monoclinic crystal structure, or a mixed structure thereof, phase-changing the initial hafnium oxide layer to a tetragonal hafnium oxide layer by heating the initial hafnium oxide layer to a phase change temperature; and rapid-cooling the tetragonal hafnium oxide layer to suppress a nucleation and growth of a monoclinic hafnium oxide from the tetragonal hafnium oxide layer.

The initial hafnium oxide layer may be formed over the substrate by atomic layer deposition, chemical vapor deposition, physical vapor deposition, or a combination thereof. A thickness of the initial hafnium oxide layer is in a range between 20 Å and 200 Å.

In an example, after the initial hafnium oxide layer is formed and before the phase-changing, heat-treating the initial hafnium oxide layer at a temperature T1 may be further performed. The phase-changing of the initial hafnium oxide layer to the tetragonal hafnium oxide layer may be performed by heating the initial hafnium oxide layer at a speed S1 for an effective heating time D1. The speed S1 may be in a range between 150° C./sec and 5×10⁸° C./sec, and the effective heating time period D1 may be between 0.05 μs and 2×10⁴ μs. The phase change temperature may be between 800° C. and 1,600° C. during the effective heating time.

The phase-changing to the tetragonal hafnium oxide layer may be performed by a rapid laser annealing process. The rapid laser annealing process may be performed using a laser spike annealing process, a flash lamp annealing process, a diode laser annealing process, or a combination thereof.

The phase-changing may be performed in an inert gas atmosphere. The rapid-cooling of the tetragonal hafnium oxide layer may be performed by cooling the tetragonal hafnium oxide layer down to a temperature T2 for an elapsed time D2. In the case, a phase change based on a Martensite-like transformation of the monoclinic hafnium oxide may not occur during the rapid-cooling.

The rapid-cooling of the tetragonal hafnium oxide layer may be performed by a descending temperature time-temperature path. The nucleation and growth of the monoclinic hafnium oxide may have a Martensite-like transformation behavior, and the Martensite-like transformation behavior may have a time-temperature-transformation curve of initiation of crystallization of a monoclinic hafnium oxide. Then the descending temperature time-temperature path may be within a left outside region of the curve.

In another view, the rapid-cooling may start at a first temperature X1 and at a first given time Y1 and completes at a second temperature X2 and at a second given time Y2. The phase-changing of the initial hafnium oxide layer to the tetragonal hafnium oxide layer may occur at a third temperature X3 and at a third give time Y3. A relation between X3 and Y3 may be defined by a function Y3=f(X3), and X1, Y1, X2, and Y2 may be selected so that Y1<f(X1) and Y2<f(X2).

The rapid-cooling may be performed for 10 ms or less. The rapid-cooling may be performed at a speed between 103° C./sec and 106° C./sec.

Heating the rapidly cooled tetragonal hafnium oxide layer to a temperature T3 may be further performed. The lowest temperature at which the phase-changing can occur may be T4, and the temperature T3 may be lower than the temperature T4.

In an example, an additional layer over the tetragonal hafnium oxide layer may be formed. The additional layer may include a silicon oxide ($SiO_2$) layer, a silicon nitride (SiN) layer, a zirconium oxide ($ZrO_2$) layer, a tantalum oxide ($Ta_2O_5$) layer, a titanium oxide ($TiO_2$) layer, an aluminum oxide ($Al_2O_3$) layer, lanthanum oxide ($La_2O_3$) layer, an yttrium oxide ($Y_2O_3$) layer, a zirconium oxide ($ZrO_2$) layer, a strontium titanium oxide ($SrTiO_3$) layer, a zirconium silicon oxide ($ZrSiO_4$) layer, a hafnium zirconium oxide ($HfZrO_4$) layer, a strontium bismuth tantalum oxide ($SrBi_2Ta_2O_9$, SBT) layer, a lead zirconium titanium oxide ($PbZr_xTi_{1-x}O_3$, PZT) layer, barium strontium titanium oxide ($Ba_xSr_{1-x}TiO_3$, BST) layer, or a stacked structure including two or more thereof.

In an example, before the phase-changing to the tetragonal hafnium oxide layer, a nucleation suppressing layer may be formed over the initial hafnium oxide layer. The nucleation suppressing layer may restrict a volume expansion due to the change of the tetragonal hafnium oxide layer into the monoclinic hafnium oxide. The nucleation suppressing may include a titanium nitride (TiN), a tantalum nitride (TaN), titanium aluminum nitride (TiAlN), titanium silicon nitride (TiSiN), tantalum carbonate (TaC), zirconium nitride (ZrN), hafnium nitride (HfN), ruthenium (Ru), or a stacked structure thereof.

The nucleation suppressing layer may comprise an aluminum oxide, a zirconium oxide, a tantalum oxide, or a titanium oxide. In an example, the nucleation suppressing layer may be doped with aluminum or silicon. A doping concentration of the aluminum or the silicon in the nucleation suppressing layer may be within a range between 0.05 weight % and 5 weight % with respect to a total weight of the nucleation suppressing layer.

According to other aspect of the present invention, a method of fabricating a semiconductor device may include providing a substrate; forming an initial hafnium oxide layer over the substrate, wherein the initial hafnium oxide layer has an amorphous structure, a monoclinic crystal structure, or a mixed structure thereof; phase-changing the initial hafnium oxide layer to a tetragonal hafnium oxide layer by heating the initial hafnium oxide layer at a temperature equal to or higher than a phase change temperature of the tetragonal hafnium oxide layer, rapid-cooling the heated tetragonal hafnium oxide layer to suppress a nucleation and growth of a monoclinic hafnium oxide from the tetragonal hafnium oxide layer; and forming an electrode or a semiconductor layer over the tetragonal hafnium oxide layer. The tetragonal hafnium oxide layer may serve as a dielectric of a capacitor or a gate insulation layer.

BRIEF DESCRIPTION OF THE DRAWINGS

The above and other features and advantages of the present invention will become more apparent from the following embodiments and the attached drawings in which:

FIGS. 3A through 3C are sectional views describing intermediate structures which are obtained in the course of fabricating a tetragonal hafnium oxide according to an embodiment;

DETAILED DESCRIPTION OF THE INVENTION

Figure 1A:
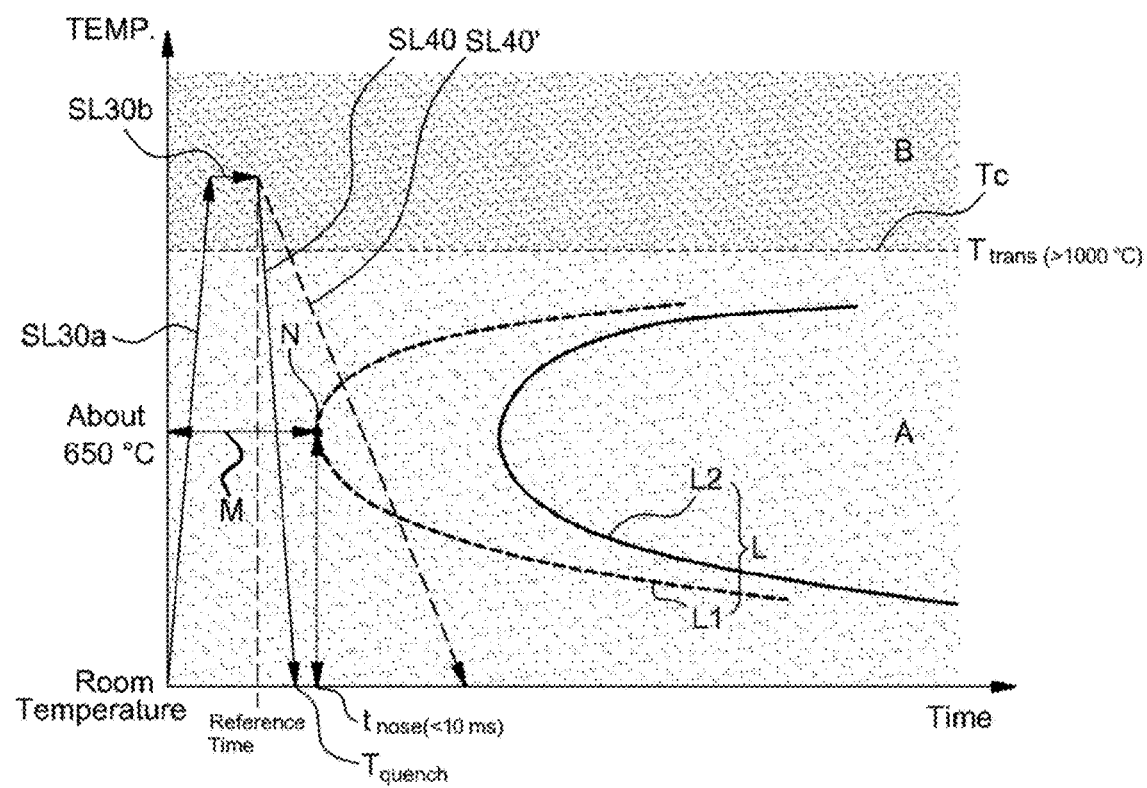
FIG. 1A illustrates a time-temperature-transformation (TTT) curve L of a monoclinic hafnium oxide for describing a method of fabricating a tetragonal hafnium oxide layer according to an embodiment of the present invention.

The present invention will now be described more fully with reference to the accompanying drawings, in which exemplary embodiments of the present invention are shown. The present invention may, however, be embodied in many different forms and should not be construed as being limited to the embodiments set forth herein; rather these embodiments are provided so that this disclosure will be thorough and complete, and will fully convey the concept of the present invention to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of description and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that when a layer is referred to as being "formed on," another layer, it can be directly formed on the other layer or intervening layers may be present therebetween. Likewise, when a material is referred to as being adjacent to another material, intervening materials may be present therebetween. In contrast, when a layer or material is referred to as being "directly" formed on, another layer or material or as being "directly" adjacent to or contacting another layer or material, there are no intervening materials or layers therebetween.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

Throughout the present specification, the term "substrate" refers to a base structure formed of semiconductor material, such as silicon, a silicon-on-insulator (SOI) or a silicon-on-sapphire (SOS), a semiconductor layer formed on a non-semiconductor base structure. The substrate may be also doped or undoped semiconductor layer, or modified semiconductor layer. Furthermore, the terms "base structure" and "semiconductor" are not limited to silicon-based materials and may generally refer to carbon based materials, polymer based materials, Group III-V semiconductor material, such as silicon-germanium, germanium, or gallium arsenide-based compound, Group II-VI semiconductor material, or mixed semiconductor material.

Figure 1B:
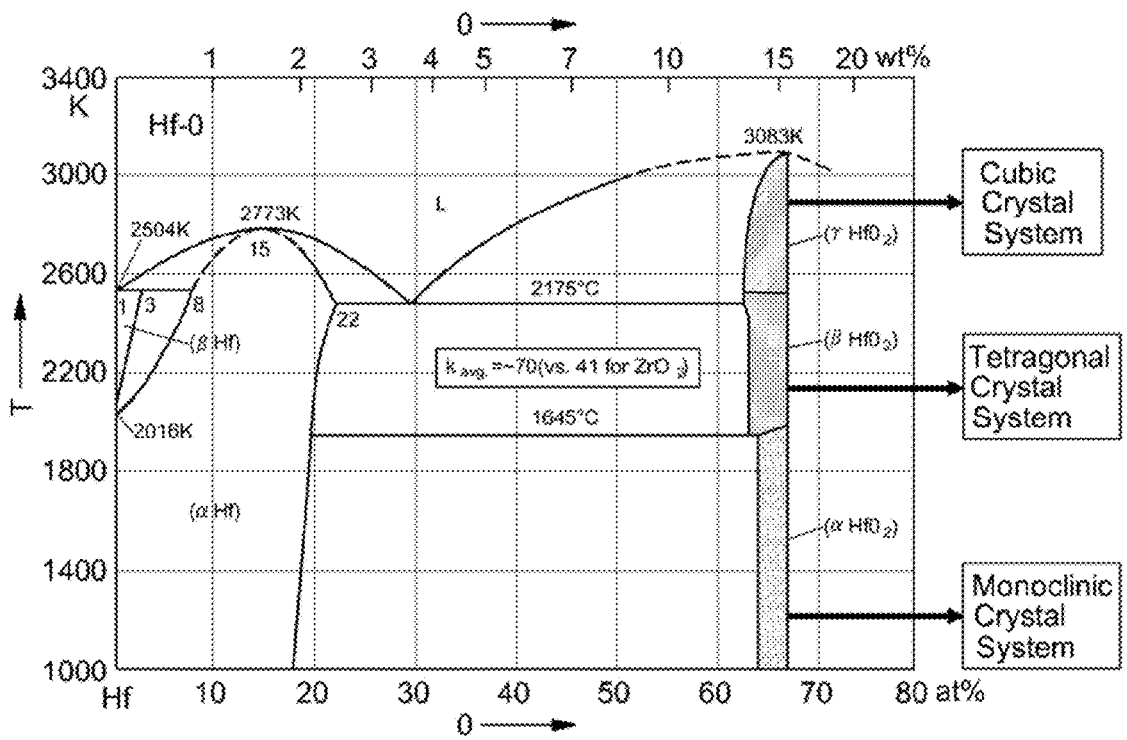
FIG. 1B illustrates a phase diagram of the hafnium oxide.
Figure 1C:
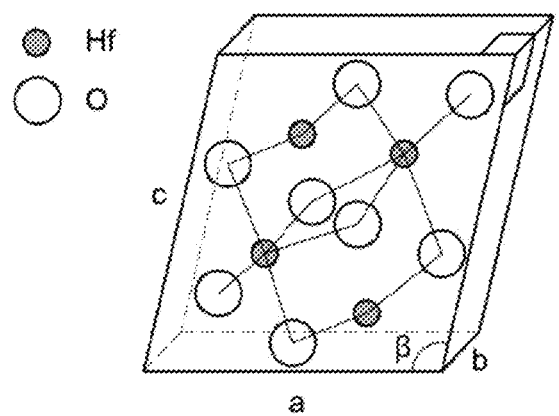
FIGS. 1C and 1D are diagrams illustrating crystal structures of hafnium oxide at equilibrium phases in regions A and B, respectively.
Figure 1D:
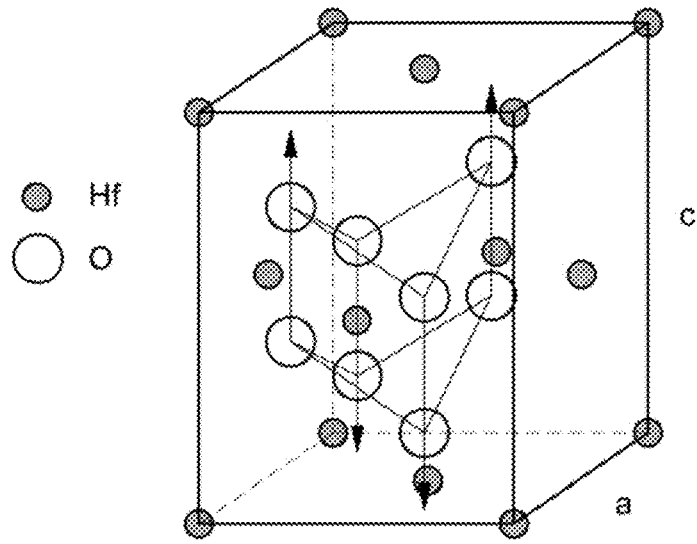

FIG. 1A is a graph illustrating a time-temperature-transformation (TTT) curve L of a monoclinic hafnium oxide. FIG. 1B is a phase diagram of the hafnium oxide, and FIGS. 1C and 1D are diagrams illustrating crystal structures of hafnium oxide at equilibrium phases in regions A and B, respectively.

Referring to FIG. 1A, the TTT curve L was qualitatively obtained by observing Martensite phase change behaviour of a monoclinic hafnium oxide, which is a low temperature stable phase. At temperature $T_{trans}$, phase change occurs from the monoclinic crystal structure shown in FIG. 1C to the tetragonal crystal structure shown in FIG. 1D. As shown in FIG. 1B, the temperature $T_{trans}$ may be equal to or higher than 800° C. However, the temperature $T_{trans}$ may vary according to composition or thickness of a thin film layer of the hafnium oxide. For example, the temperature $T_{trans}$ may be within a range of between 800° C. and 1,600° C. The monoclinic crystal structure is the stable phase at a temperature below the temperature $T_{trans}$ (the hatched region A), whereas the tetragonal crystal structure is the stable phase at a temperature equal to or above the temperature $T_{trans}$ (the hatched region B).

The TTT curve L in the region A describes dependency of phase change of a monoclinic hafnium oxide that shows a Martensite-behavior on temperature and time. The dependency of the phase change of the monoclinic hafnium oxide on the temperature and time may be described in two stages including nucleation and thermally activated growth. The nucleation refers to the stage in which nuclei having a new phase are formed from a previous phase, whereas the thermally activated growth refers to the stage in which crystal grains grow from materials diffused and a phase change occurs from the previous phase to the new phase as a size of the nuclei gradually increases.

In the TTT curve L, a first curve L1 is a curve indicating initiation of crystallization for a crystalline monoclinic hafnium oxide, whereas a second curve $L_2$ is a curve indicating completion of the crystallization for the crystalline monoclinic hafnium oxide. A method of fabricating tetragonal hafnium oxide according to an embodiment of the present invention includes a rapid cooling operation that is performed in a region to the left of the first curve L1 to suppress formation of nuclei of monoclinic hafnium oxide crystals. Detailed description thereof will be given below.

Figure 2:
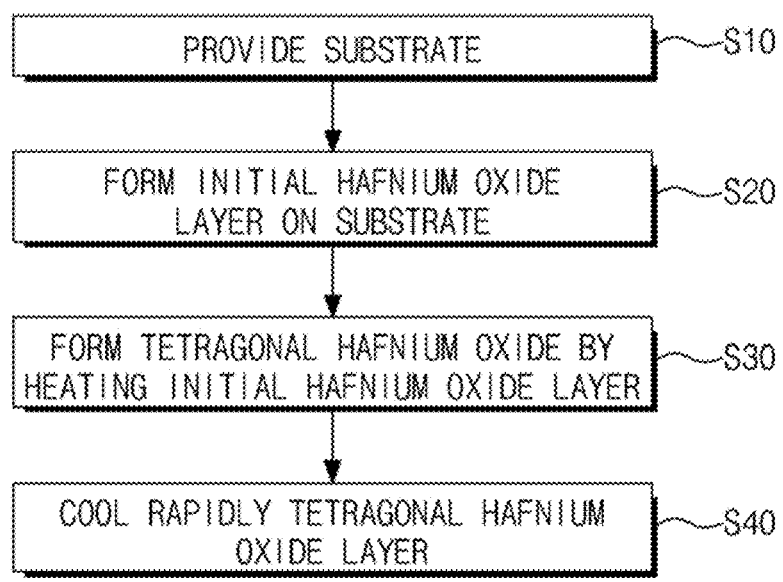
FIG. 2 is a diagram illustrating a method of fabricating a tetragonal hafnium oxide layer according to an embodiment of the present invention.
Figure 3A:
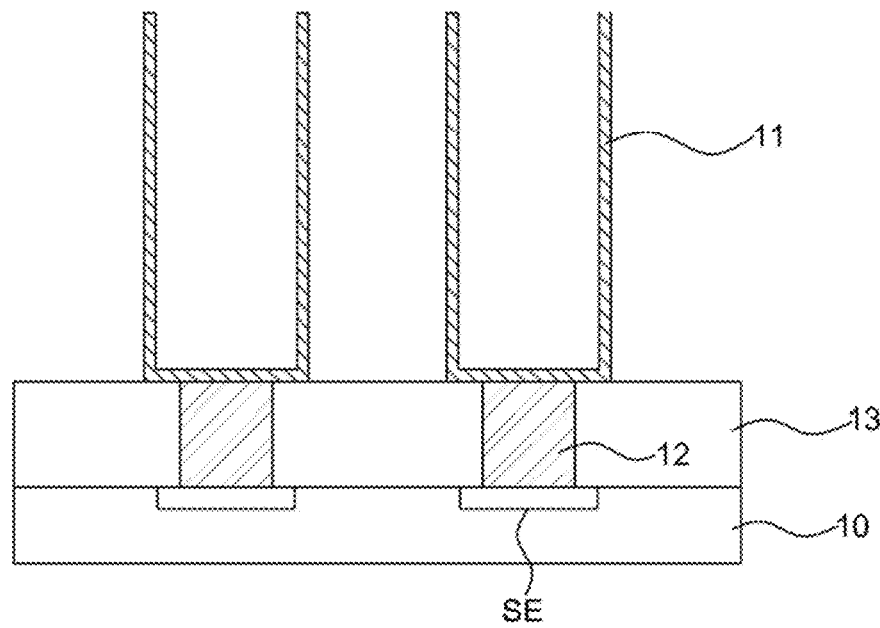
Figure 3B:
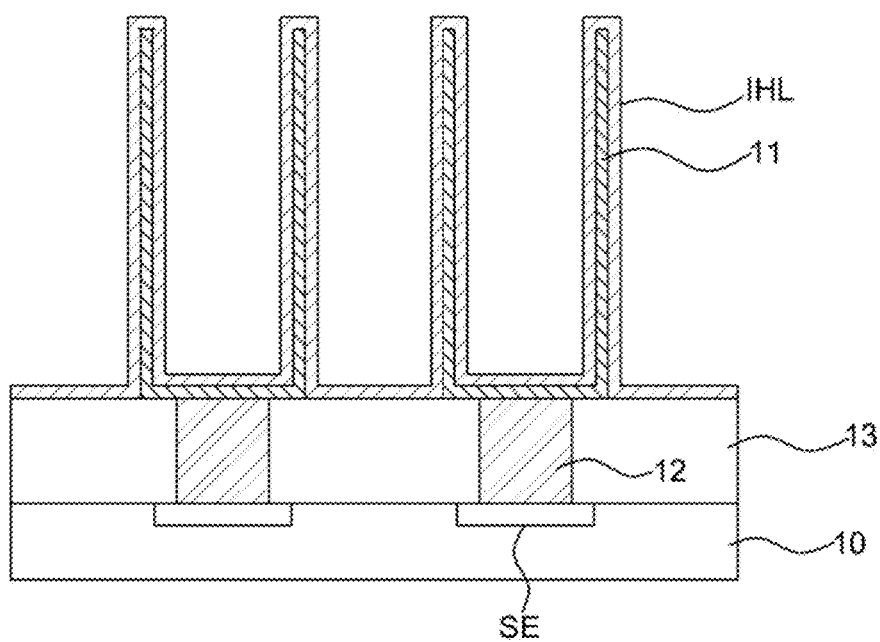

FIG. 2 is a diagram illustrating a method of fabricating a tetragonal hafnium oxide layer according to an embodiment of the present invention, and FIGS. 3A through 3C are sectional view diagrams for describing intermediate structures obtained in the course of fabricating a tetragonal hafnium oxide.

Referring to FIGS. 2 and 3A, a substrate 10 is provided. The substrate 10 may provide a surface on which an initial hafnium oxide layer is formed and the substrate 10 may have an arbitrary shape. The substrate 10 may be a base structure formed of silicon, silicon-on-insulator (SOI), silicon-on-sapphire (SOS), germanium, carbon-based material, polymer-based material, Group III-V or Group II-VI semiconductor material such as silicon-germanium, germanium, or a gallium arsenide-based compound, or a combination of these semiconductor materials. Alternatively, the substrate 10 may be a semiconductor layer formed on the base structure, a doped or undoped semiconductor layer, a modified semiconductor layer, a conductive layer, or a dielectric layer itself.

In an example of the present invention, the substrate 10 may include a switching element such as a diode or a transistor, or a conductor such as an electrode or a wiring. FIG. 3A shows a field effect transistor SE as the switching element, a first electrode 11 as the conductor, and a via conductor 12 for electrically interconnecting the first electrode 11 and the field effect transistor SE to each other. For electrical isolation of these above-stated elements, a suitable insulation layer 13 may be formed on the substrate 10.

The first electrode 11 may be a bottom electrode of a capacitor. The bottom electrode may be electrically connected to the field effect transistor SE and constitute a memory device, such as a dynamic random access memory (DRAM). In an example, the first electrode 11 may contain silicon (Si), platinum (Pt), tungsten (W), gold (Au), palladium (Pd), rhodium (Rh), iridium (Ir), ruthenium (Ru), tantalum (Ta), titanium (Ti), molybdenum (Mo), chromium (Cr), vanadium (V), a conductive nitride thereof (for example, TiN), a conductive oxide thereof (for example, $RuO_2$ or $SrRuO_3$), a compound composition like an alloy thereof, or a stacked structure including two or more layers thereof. However, these are merely examples, and the present invention is not limited thereto.

As shown in FIG. 3A, the first electrode 11 may have a 3-dimensional cylindrical shape. However, it is merely an example, and the present invention is not limited thereto. According to another example, the first electrode 11 may have a 3-dimensional shape coated on a trench formed in the substrate 10 in a depth-wise direction or may have a simple flat panel-like shape.

Referring to FIG. 3B along with FIG. 2, an initial hafnium oxide layer IHL is formed on the substrate 10 (operation S20). The initial hafnium oxide layer IHL may include an amorphous structure, a monoclinic crystal structure, or a mixed structure in which the amorphous structure and the monoclinic crystal structure are uniformly or non-uniformly distributed. As described above with reference to FIG. 3A, when the first electrode 11 is formed, the initial hafnium oxide layer IHL may be formed on the first electrode 11.

The initial hafnium oxide layer IHL may be formed via vapor deposition, such as chemical vapor deposition, physical vapor deposition (for example, sputtering or evaporation), or atomic layer deposition using a suitable hafnium precursor and an oxidizer, or liquid phase deposition such as a sol-gel operation. In an example, the initial hafnium oxide layer IHL may not include any impurity other than hafnium and oxygen. As a temperature of a tetragonal hafnium oxide layer formed at a high temperature, drops by cooling the tetragonal hafnium oxide layer, the impurity, if present, may accelerate a phase change of the tetragonal hafnium oxide layer to a monoclinic crystal structure of hafnium oxide, as described below.

In an example, the initial hafnium oxide layer IHL may be formed by atomic layer deposition using a hafnium precursor and an oxygen-containing gas. The hafnium precursor may be a hafnium tetrachloride ($HfCl_4$) or tetrakis(dialkylamino) hafnium compound such as tetrakis(diethylamino) hafnium (($Et_2N)_4Hf$ or TDEAH). However, the present invention is not limited thereto. The oxygen-containing gas may be oxygen ($O_2$), ozone ($O_3$), or water vapor ($H_2O$) but is not limited thereto. In the atomic layer deposition, the initial hafnium oxide layer IHL may be formed by performing at least one cycle of alternate pulse-injection of the hafnium precursor and the oxygen-containing gas into a chamber in which the substrate is placed and by performing a purging operation between the pulse injections.

The initial hafnium oxide layer IHL may be formed at a temperature below or equal to the phase-change temperature $T_{trans}$. Since the initial hafnium oxide layer IHL is stable in an amorphous structure, a monoclinic crystal structure, or a mixed structure thereof, at the temperature below or equal to the phase-change temperature $T_{trans}$, The initial hafnium oxide layer IHL may be easily formed by using any thin-film forming method other than the atomic layer deposition described above. In an example, the initial hafnium oxide layer IHL may be formed at a temperature within a range of between 100° C. and 500° C., which is below the phase-change temperature $T_{trans}$. Alternatively, after the formation of the initial hafnium oxide layer IHL, a heat treatment operation may further be performed at a temperature below the temperature $T_{trans}$ such that the initial hafnium oxide layer IHL has a uniform monoclinic hafnium oxide crystal structure. The heat treatment operation may be performed at a temperature within a range of between 400° C. and 750° C., and the initial hafnium oxide layer IHL formed as such may dominantly have a monoclinic crystal structure in the range of the annealing temperature.

In an example, a thickness of the initial hafnium oxide layer IHL may be in a range between 20 Å and 200 Å. When the thickness of the initial hafnium oxide layer IHL is below 20 Å, a leakage current or an insulation breakdown may occur due to a defect, such as a crack, induced during a subsequent phase change process or a rapid cooling process. Furthermore, when the thickness of the initial hafnium oxide layer IHL is below 20 Å, the temperature at which the initial hafnium oxide layer IHL is crystallized to a tetragonal hafnium oxide layer may be raised too high, and thus, a thermal shock or a thermal budget may be induced to adjacent regions or an interface during a process for crystallization into the tetragonal hafnium oxide. When the thickness of the initial hafnium oxide layer IHL exceeds 200 Å, it is difficult to dissipate heat from tetragonal hafnium oxide during the rapid cooling process. Thus, an undesired nucleation of a monoclinic hafnium oxide structure may be induced in the tetragonal hafnium oxide during the rapid cooling process. In addition, capacitance of a capacitor employing the tetragonal hafnium oxide may be reduced.

Next, the initial hafnium oxide layer IHL formed on the first electrode 11 is heated up to a nucleation temperature for forming a tetragonal hafnium oxide layer. That is, the temperature is raised up to a higher temperature than the temperature $T_{trans}$ and the raised temperature is maintained for a predetermined time to induce a sufficient crystal grain growth of tetragonal crystalline structure, thereby changing the crystal structure of the initial hafnium oxide layer IHL into a tetragonal hafnium oxide layer (operation S30).

The above-stated heat treatment method for crystallizing the initial hafnium oxide layer IHL to the tetragonal hafnium oxide layer may include raising the temperature at a speed of a range between 150° C./sec and $5 \times 10^{7}$° C./sec. According to a preferred example of the present invention, the temperature-raising speed is between $0.4 \times 10^{5}$° C./sec and $5 \times 10^{7}$° C./sec. The heat treatment be shown as a rising temperature time-temperature path SL30a of FIG. 1A. The rising temperature time-temperature path SL30a may be a linear path, but is not limited to a linear path. In other example, the rising temperature time-temperature path SL30a may also have a non-linear curve or a non-continuous pattern.

The initial hafnium oxide layer IHL may be heated for a predetermined time duration at a temperature equal to or higher than the temperature $T_{trans}$. The time duration for heating at a temperature equal to or higher than the temperature $T_{trans}$ is referred to as an effective heating time. For example, the heat treatment may be shown as a heating time-temperature path SL30b of FIG. 1A. The effective heating time may correspond to the length of the time axis of the heating time-temperature path SL30b. The effective heating time of the heating time-temperature path SL30b may be within a range of between 0.05 μs and $2 \times 10^4$ μs.

When the heating time exceeds $2 \times 10^4$ μs, an interface between the initial hafnium oxide layer IHL and an underlying layer under the initial hafnium oxide layer IHL may be deteriorated, or elements, layers, or members (e.g., SE and 12 of FIG. 3B) which are formed on the substrate 10 may suffer thermal shocks. On the other hand, when the effective heating time is less than 0.05 μs, sufficient heat energy cannot be supplied to the initial hafnium oxide layer IHL and thus, the initial hafnium oxide layer IHL may be insufficiently crystallized to a tetragonal hafnium oxide.

Although the heating time-temperature path SL30b indicates that a temperature which is equal to or above the temperature $T_{trans}$ is maintained constantly for a given time period, the present invention is not limited thereto. For example, in another example, a heating time-temperature path may have a pulse-like pattern and the maximum temperature of the pulse-like pattern may be equal to or above the temperature $T_{trans}$. In another example, a heating time-temperature path has various patterns which may increase or decrease in a linear or a non-linear manner between the maximum temperature and a minimum temperature. The minimum temperature may be below the temperature $T_{trans}$.

In an example, the rising temperature time-temperature path SL30a and the heating time-temperature path SL30b may be performed by a rapid laser annealing. Preferably, the rapid laser annealing may be laser spike annealing, flash lamp annealing, or diode laser annealing. In an example, the laser spike annealing may be performed by using a laser beam having a wavelength of 10.6 μm. The flash lamp annealing may be performed by using a laser beam having a wavelength from about 0.5 μm to about 0.8 μm. The diode annealing may be performed by using a laser beam having a wavelength of 0.8 μm. However, the above-stated ranges of wavelengths of laser beams are merely examples, and the present invention is not limited thereto. The ranges of wavelengths of laser beams may vary according to a laser source selected and an absorption rate of laser energy by the initial hafnium oxide layer IHL.

In an example, during the heating time-temperature path SL30b, the substrate 10 may be scanned for controlling a heating time and a heat quantity, and inducing a phase change of the entire initial hafnium oxide layer IHL into a tetragonal hafnium oxide layer. In addition, a distance between a rapid laser annealing unit and the substrate 10 may be adjusted. Furthermore, in one example, during the rising temperature time-temperature path SL30a and the heating time-temperature path SL30b or only during the heating time-temperature path SL30b, an ambient gas around the substrate 10 may be an inert gas, such as neon (Ne), argon (Ar), helium (He), or a combination thereof.

After a phase change process is completed via the rising temperature time-temperature path SL30a and the heating time-temperature path SL30b, to maintain the tetragonal hafnium oxide layer, that is, to suppress nucleation and growth of a monoclinic hafnium oxide in the tetragonal hafnium oxide layer, the tetragonal hafnium oxide layer is rapidly cooled to a temperature below or equal to the temperature $T_{trans}$ (operation S40). The rapid cooling may follow a descending temperature time-temperature path and may not cross the curve L1 which indicates an initiation of crystallization of a monoclinic crystal structure in the TTT curves. See curve L in FIG. 1A.

Referring to FIG. 1A, the rapid cooling may follow a descending temperature time-temperature path SL40. The descending temperature time-temperature path may exhibit a temperature descending speed in a range of between $10^{3\circ}$ C./sec and $10^{6\circ}$ C./sec. However, the temperature descending speed may be moderated in a range of between 150° C./sec and $10^{6\circ}$ C. C/sec by introducing a nucleation suppressing layer as described below, and a window of the temperature descending speed may be widened.

In an example, a cooling gas may be provided into a chamber in which the substrate 10 with a phase-changed tetragonal hafnium oxide layer is placed. The cooling gas is in a gas state at a temperature of between −100° C. and 25° C. and may be an inert gas such as helium, nitrogen, neon, argon, or a mixture thereof, for example.

Since a tetragonal hafnium oxide may be phase-changed to a monoclinic hafnium oxide via a Martensite-like transformation which does not accompany diffusion of atoms or material, the descending temperature time-temperature path SL40 may remain in a region which is not contacting or crossing the curve L1 at which an initiation of crystallization into a monoclinic crystal structure starts. Thus, a nucleation of a monoclinic hafnium oxide is suppressed. In this case, the descending temperature time-temperature path SL40 may remain in a left region to the curve L1 at which an initiation of crystallization into a monoclinic crystal structure starts. Meanwhile, when the descending temperature time-temperature path extends into a right region to the curve L1 (for example, SL40' of FIG. 1A), a tetragonal hafnium oxide may be phase-changed into a monoclinic hafnium oxide.

The crystallization into a tetragonal crystal structure is completed at a reference time point. See FIG. 1A. A nose N of the curve L1 at which an initiation of crystallization starts is about 10 ms a temperature about 650° C. Therefore, in one example, when the descending temperature time-temperature path SL40 is performed in the left outside region of the curve L1, the descending temperature time-temperature path SL40 may be within about 10 ms or less. However, as described below, when a nucleation suppressing layer is employed, the descending temperature time-temperature path SL40 may occur in a range between 5 sec and 10 sec.

In another view, the rapid-cooling may start at a first temperature X1 and at a first given time Y1 and completes at a second temperature X2 and at a second given time Y2. The phase-changing of the initial hafnium oxide layer to the tetragonal hafnium oxide layer may occur at a third temperature X3 and at a third give time Y3. A relation between X3 and Y3 may be defined by a function Y3=f(X3), and X1, Y1, X2, and Y2 may be selected so that Y1<f(X1) and Y2<f(X2).

For example, a final temperature $T_{quench}$ of the rapid cooling may be lower than a temperature at the nose N. For example, the final temperature $T_{quench}$ may be the room temperature. According to another embodiment, to reduce thermal shocks, the rapid cooling may follow a multi-stage descending temperature path in which a temperature is lowered in a step-wise manner in a temperature region below the nose N. For example, a temperature of 500° C., which is lower than the temperature at the nose N, may be maintained for a predetermined time period, for example, 5 ms, and then the temperature may be descended to the room temperature.

In another example, the rapid cooling may include a cooling process and a heating process after the cooling process. For example, in the cooling process, the substrate 10 may be cooled to a temperature below 0° C., and then a heating process for heating the substrate 10 back to the room temperature or to a predetermined temperature below the nose N may be performed. In this case, unlike the common aging, the heating process may be performed for a time period in a left region of the curve L1 so that the heating process is not contacting the curve L1, at which an initiation of crystallization of a monoclinic hafnium oxide starts. In this case, since a nucleation of a crystal structure of a monoclinic hafnium oxide may hardly occur and a diffusion of atoms is too slow, a phase change into a monoclinic hafnium oxide hardly occurs.

As described above, after a tetragonal hafnium oxide layer FHL is formed, a new conductive layer, for example, a second electrode (not shown), may be formed on the tetragonal hafnium oxide layer FHL. Therefore, a capacitor may be formed in which the tetragonal hafnium oxide layer FHL serves as a dielectric between the first electrode 11 and the second electrode. The second electrode may contain the same material as the first electrode 11.

Since the tetragonal hafnium oxide layer FHL exhibits a high dielectric permittivity and a wide band gap, the tetragonal hafnium oxide layer FHL may exhibit a small leakage current and an enhanced operation capacity despite a small cell size. Therefore, an ultra-fine capacitor may be provided. Furthermore, the capacitor, which employs the tetragonal hafnium oxide layer FHL as a dielectric, is connected to a switching element SE, forming a DRAM device having a 1T-1C structure.

In another example, unlike the first electrode 11 as shown in FIG. 3A, a first electrode may have a flat panel-like shape. In this case, the flat panel-like capacitor including a tetragonal hafnium oxide layer FHL may be provided. Also, in another example, capacitors having various 3-dimensional shapes, such as a trench-type capacitor or a pillar-type capacitor, may be provided in the substrate 10 depending on a shape of the first electrode 11. However, the present invention is not limited thereto.

In one example, prior to the formation of the second electrode, another dielectric layer having process compatibility with the tetragonal hafnium oxide layer FHL may further be formed on the tetragonal hafnium oxide layer FHL. For example, the dielectric layer may include silicon oxide (SiO$_2$) layer, silicon nitride (SiN) layer, zirconium oxide (ZrO$_2$) layer, tantalum oxide (Ta$_2$O$_5$) layer, titanium oxide (TiO$_2$) layer, aluminum oxide (Al$_2$O$_3$) layer, lanthanum oxide (La$_2$O$_3$) layer, yttrium oxide (Y$_2$O$_3$) layer, zirconium oxide (ZrO$_2$) layer, strontium titanium oxide (SrTiO$_3$) layer, zirconium silicon oxide (ZrSiO$_4$) layer, hafnium zirconium oxide (HfZrO$_4$) layer, strontium bismuth tantalum oxide (SrBi$_2$Ta$_2$O$_9$, SBT) layer, lead zirconium titanium oxide (PbZr$_x$Ti$_{1-x}$O$_3$, PZT) layer (0<x<1), barium strontium titanium oxide (Ba$_x$Sr$_{1-x}$TiO$_3$, BST) layer (0<x<1), or a stacked structure including two or more thereof. When the dielectric layer includes a stacked structure including two or more thereof, a dielectric layer stack having a multi-layered structure may be provided.

Although the above-stated examples are related to a capacitor, the present invention is not limited thereto. For example, a gate electrode may be formed on the tetragonal hafnium oxide layer FHL to fabricate a field-effect transistor. In another embodiment, the tetragonal hafnium oxide layer FHL may be formed on a gate electrode layer and a semiconductor layer, such as a channel layer, may be formed on the tetragonal hafnium oxide layer FHL to provide a transistor having a reversed structure. In this case, the tetragonal hafnium oxide layer FHL may induce a strong capacitive coupling between the channel layer and a gate electrode and increase a channel current density at a given gate voltage, thereby forming a low-power and high-efficient transistor. In another example, the tetragonal hafnium oxide layer FHL serves as an information storing layer for a non-volatile memory such as a resistive switching memory.

As in the above-stated embodiment, in the left region to the curve L1 at which an initiation of crystallization to a monoclinic crystal structure occurs, when the tetragonal hafnium oxide layer is rapidly cooled in a thermal equilibrium at a temperatures equal to or above the temperature $T_{trans}$, a nucleation of monoclinic crystals does not substantially occur. Even if the nucleation for the crystallization occurs, a sufficient time for crystal grain growth is not secured, and thus a monoclinic hafnium oxide is not formed easily. As a result, a tetragonal hafnium oxide layer formed in a high temperature region may be maintained as a meta-stable phase even at the room temperature.

Therefore, according to an embodiment, to form a tetragonal hafnium oxide layer, the tetragonal hafnium oxide layer is formed only via thermal processes including high temperature heating and rapid cooling without forming a seed layer for nucleation of a tetragonal hafnium oxide below the tetragonal hafnium oxide layer. Thus, an additional operational cost for an introduction of the seed layer, pollution to adjacent layers due to diffusion of an impurity from the seed layer, or deterioration of device properties thereby may be reduced or eliminated.

In case that the seed layer is employed, since a dielectric permittivity of the seed layer is not greater than that of the tetragonal hafnium oxide layer, the overall dielectric permittivity may decreases. However, these problems do not occur in embodiments of the present invention. Furthermore, a doped impurity generally increases crystallizing temperature. Furthermore, considering that a doped impurity generally increases crystallization temperature, the crystallization temperature may be lowered according to examples of the present invention, compared to a case in which a tetragonal hafnium oxide layer is fabricated using the doped impurity.

Furthermore, in terms of energy, a nucleation for a phase change of a material occurs more easily and preferably at a place where a structural defect exists, such as, at a boundary between crystal grains, at a free surface, or at a surface of an inclusion (non-metal impurity), than at a homogeneous and random surface. Therefore, the impurity may accelerate a nucleation of a monoclinic hafnium oxide layer, which is a stable and predominant structure at a low temperature, and thus the doping of impurity is neither efficient nor preferable for obtaining the tetragonal hafnium oxide layer.

Figure 4:
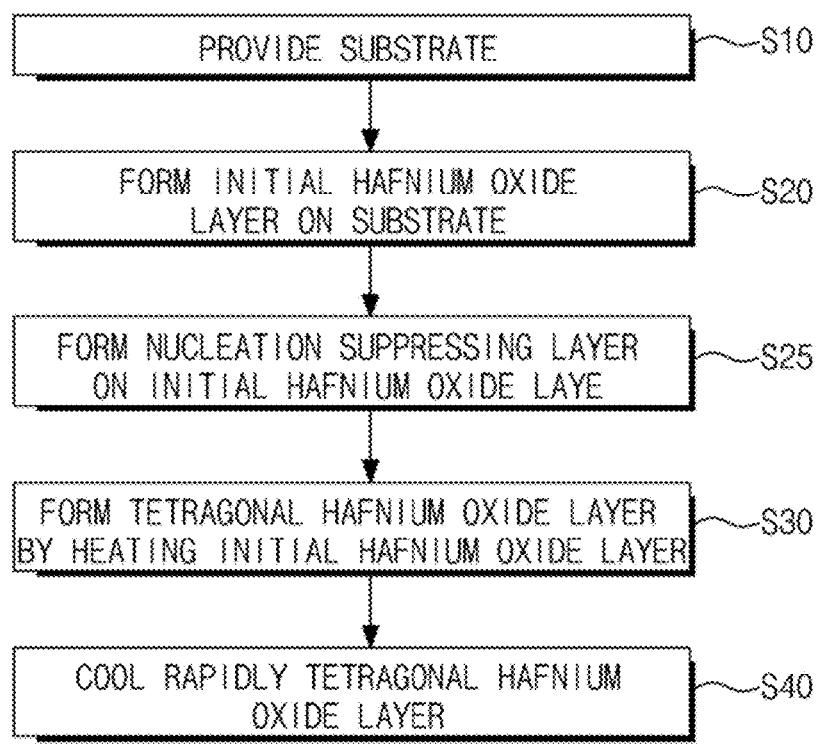
FIG. 4 is a flowchart illustrating a method of fabricating a tetragonal hafnium oxide layer according to another embodiment.
Figure 5A:
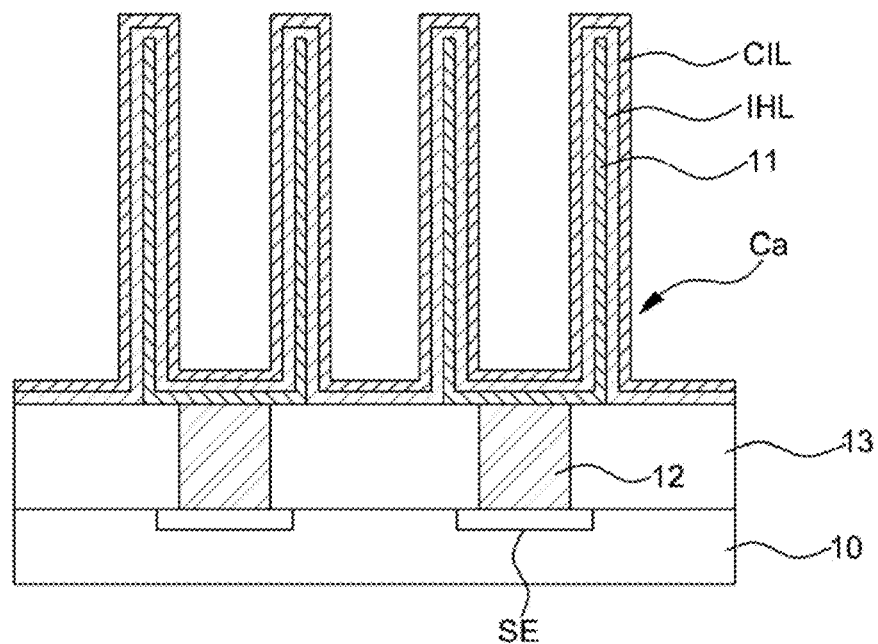
FIGS. 5A and 5B are sectional views illustrating a method of fabricating a tetragonal hafnium oxide layer as shown in FIG. 4.
Figure 5B:
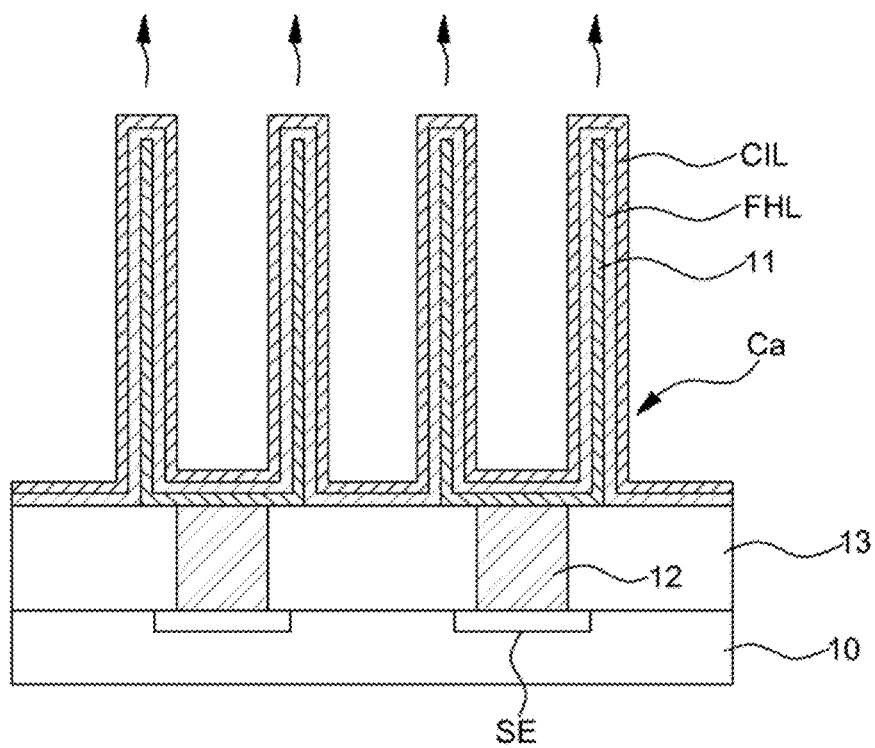
Figure 6A:
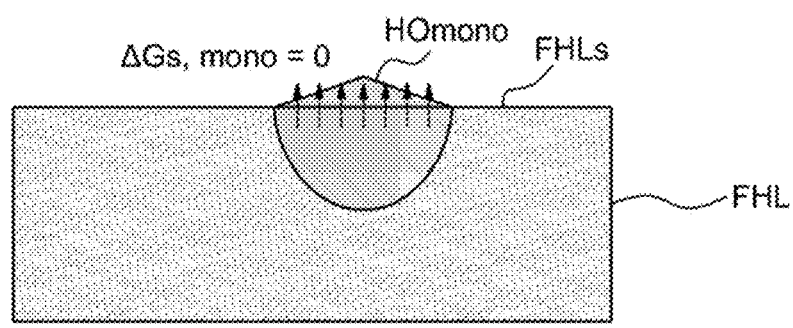
FIGS. 6A and 6B are sectional views for describing function of a nucleation suppressing layer CIL.
Figure 6B:
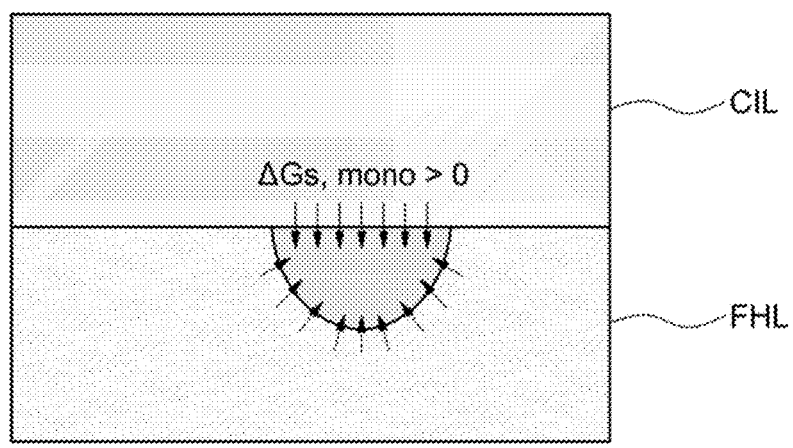

FIG. 4 is a flowchart illustrating a method of fabricating a tetragonal hafnium oxide layer according to another embodiment, and FIGS. 5A and 5B are sectional views illustrating a method of fabricating a tetragonal hafnium oxide layer. FIGS. 6A and 6B are sectional views for describing a function of a nucleation suppressing layer CIL.

Referring to FIGS. 4 and 5A, a substrate 10 is prepared (operation S10). As described above, an initial hafnium oxide layer IHL, which is in an amorphous structure, a monoclinic crystal structure, or a mixed structure thereof, is formed on the substrate 10 (operation S20). The initial hafnium oxide layer IHL may be formed at a temperature below or equal to a temperature $T_{trans}$.

To prevent a phase change to a monoclinic hafnium oxide, a nucleation suppressing layer CIL for suppressing nucleation of a monoclinic hafnium oxide may be further formed on the initial hafnium oxide layer IHL (operation S25). The nucleation suppressing layer CIL may include a titanium nitride (TiN), a tantalum nitride (TaN), titanium aluminum nitride (TiAlN), titanium silicon nitride (TiSiN), tantalum carbonate (TaC), zirconium nitride (ZrN), hafnium nitride (HfN), and ruthenium (Ru), or a stacked structure thereof. According to another embodiment, the nucleation suppressing layer CIL may include aluminum oxide, zirconium oxide, tantalum oxide, titanium oxide, or a combination thereof. According to some embodiments, the nucleation suppressing layer CIL may be doped with a small amount of aluminum or silicon, for example, at a ratio of between 0.05 weight % and 5 weight %. The nucleation suppressing layer CIL is a separate layer formed on the initial hafnium oxide layer IHL and should be distinguished from a doped material which is formed in the initial hafnium oxide layer IHL by doping the initial hafnium oxide layer IHL with an impurity, the difference of which will be clearly described below with reference to FIGS. 6A and 6B.

Thickness of the nucleation suppressing layer CIL may be within a range of between 10 Å and 200 Å. When the nucleation suppressing layer CIL is a non-continuous layer, a phase change from a tetragonal hafnium oxide at a meta-stable phase to a monoclinic hafnium oxide may be accelerated. When the thickness of the nucleation suppressing layer CIL is below 10 Å, it is difficult to form the nucleation suppressing layer CIL as a continuous layer. When the thickness of the nucleation suppressing layer CIL exceeds 200 Å, heat dissipation of a tetragonal hafnium oxide layer may be retarded during a rapid cooling S40 of the tetragonal hafnium oxide layer, and thus a nucleation and crystal grain growth of the monoclinic hafnium oxide may be induced.

Next, referring to FIGS. 4 and 5B, a tetragonal hafnium oxide layer FHL is formed by heating the initial hafnium oxide layer IHL (operation S30). Next, after the phase change from the initial hafnium oxide layer IHL to the tetragonal hafnium oxide layer FHL is completed, the tetragonal hafnium oxide layer FHL is rapidly cooled down to a temperature below the temperature $T_{trans}$ to maintain the tetragonal hafnium oxide layer FHL (operation S40). The rapid cooling is performed via a rapid cooling path which is not contacting a curve L1 at which an initiation of crystallization of the monoclinic crystal structure starts. In this case, the descending temperature time-temperature path regarding the rapid cooling exists in the left region to a curve L at which an initiation of crystallization of the monoclinic crystal structure occurs.

A monoclinic hafnium oxide (refer to FIG. 1B) has smaller density than a tetragonal hafnium oxide (refer to FIG. 1C). According to an embodiment, when a phase change from the tetragonal hafnium oxide to the monoclinic hafnium oxide occurs, volume increases about 3%. Therefore, if such a volume increase (volumetric expansion) can be suppressed, nucleation of the monoclinic hafnium oxide may be suppressed even at a low temperature below $T_{rans}$, for example, at a room temperature, and thus the tetragonal hafnium oxide at a meta-stable phase may be maintained even at a room temperature. The Equation 1 below shows free energy $\Delta G$ associated with a phase change from a monoclinic hafnium oxide to a tetragonal hafnium oxide.

$$\Delta G = -\Delta G_{v,mono} + [\gamma_{air/mono} + \gamma_{tetra/mono}] + \Delta G_{s,mono} - \Delta G_d \quad \text{[Equation 1]}$$

Here, $\Delta G_{v,mono}$ denotes a change of free energy regarding a phase change to a monoclinic hafnium oxide in the vacuum, $\gamma_{air/mono}$ denotes a surface energy of an interface between the air and a monoclinic hafnium oxide, $\gamma_{tetra/mono}$ denotes a surface energy of an interface between a tetragonal hafnium oxide and a monoclinic hafnium oxide, $\Delta G_{Gs,mono}$ denotes a change in strain energy regarding a phase change to a monoclinic hafnium oxide, and $\Delta G_d$ denotes a change in energy during a nucleation at a defect such as, a grain boundary, a phase interphase, etc.

A nucleation suppressing layer CIL according to an embodiment is arranged above a phase-changed tetragonal hafnium oxide layer and restricts deformation associated with a volume increase induced due to a nucleation of a monoclinic hafnium oxide during the rapid cooling. Referring to Equation 1, in terms of the free energy $\Delta G$, the nucleation suppressing layer CIL suppresses a phase change into a monoclinic hafnium oxide by increasing $\Delta G_{s,mono}$, and thus a crystal structure of a tetragonal hafnium oxide layer is maintained as a meta-stable phase even at the room temperature.

Furthermore, the nucleation suppressing layer CIL covers the top surface of the tetragonal hafnium oxide, thereby suppressing a heterogeneous nucleation of a monoclinic hafnium oxide, which may easily occur in terms of energy when the tetragonal hafnium oxide is exposed as a free surface. Referring to FIG. 6A, a free surface FHLs of the phase-changed tetragonal hafnium oxide layer FHL may be easily phase-changed to a monoclinic hafnium oxide $HO_{mono}$. However, as shown in FIG. 6B, since the nucleation suppressing layer CIL exists on the tetragonal hafnium oxide layer FHL, a nucleation of a monoclinic hafnium oxide is difficult to occur as $-\Delta G_d$ increases from the free energy of Equation 1. Furthermore, as indicated with the arrow, $\Delta G_{s,mono}$ increases due to a volume expansion restricting effect of the nucleation suppressing layer CIL, and thus a phase change to the monoclinic hafnium oxide $HO_{mono}$ during a rapid quenching is suppressed. As a result, a process window, including a rapid cooling process time, may be further expanded.

Hereinafter, referring to experimental examples, the present invention will be described in detail. The below disclosures are merely examples for description and the present invention should not be construed as being limited thereto.

EXPERIMENTAL EXAMPLE 1

A hafnium oxide layer was fabricated on a substrate according to an embodiment of the present invention. The substrate was a silicon substrate, where a ruthenium oxide layer was formed on the substrate as a bottom electrode to form a capacitor structure. Next, an amorphous initial hafnium oxide layer was formed on the bottom electrode. The initial hafnium oxide layer IHL was deposited in an atomic layer deposition process by using a hafnium precursor and an oxygen-containing gas. The hafnium precursor is a tetrakis(dialkylamino) hafnium compound such as hafnium tetrachloride ($HfCl_4$) or a tetrakis(diethylamino) hafnium (($Et_2N$)4Hf or TDEAH). However, as previously stated, the present invention is not limited thereto. In the experimental example, hafnium tetrachloride was used in the Example 1.

The oxygen-containing gas may be oxygen ($O_2$), ozone ($O_3$), or vapour ($H_2O$). Oxygen was used in the Example 1. An initial hafnium oxide layer IHL having a thickness of 100 Å was formed by performing a cycle 10 times which includes injection of pulses into a chamber in which the substrate is placed and purging operations between each of the pulse injections.

Next, for crystallization of the initial hafnium oxide layer, the initial hafnium oxide layer was heat-treated at 1,000° C. for an effective heating time of about 0.13 μs via laser spike annealing using a laser beam having a wavelength of 380 nm with a temperature rising speed equal to or above 150° C./sec. As a result, the initial hafnium oxide layer was phase-changed to a tetragonal hafnium oxide. The heat treatment was performed in a nitrogen atmosphere. Next, the laser spike annealing stopped at a temperature corresponding to the nose of a TTT curve, that is, between 500° C. and 800° C. for up to 10 ms, and argon was injected into the chamber as a quenching gas, thereby rapidly cooling the tetragonal hafnium oxide layer at a rate equal to or above $7 \times 10^{4 \circ}$ C.

EXPERIMENTAL EXAMPLE 2

As in the above Experimental Example 1, an initial hafnium oxide layer IHL was formed on a substrate, and a nucleation suppressing layer was formed on the initial hafnium oxide layer before a thermal treatment for phase-changing the initial hafnium oxide layer. The nucleation suppressing layer was a TiN layer. The TiN layer was formed to a thickness of about 100 Å via sputtering.

Next, similar to the Experimental Example 1, for crystallization of the initial hafnium oxide layer, the initial hafnium oxide layer was thermally treated at 1,000° C. for an effective time duration, that is, for about 0.18 μs and 1.3 μs. Here, the effective heating time of 1.3 μs was obtained by repeating a total of ten times the laser spike annealing with a laser beam of 0.53 J for 0.13 μs.

The laser spike annealing changed the initial hafnium oxide layer to a tetragonal hafnium oxide. The heat treatment was performed in the nitrogen atmosphere. Next, the laser spike annealing stopped to limit annealing time at a temperature corresponding to the nose of a TTT curve, that is, at a temperature between 500° C. and 800° C. for up to 10 ms, and argon was injected into the chamber as a quenching gas, thereby rapidly quenching the tetragonal hafnium oxide layer at a rate equal to or above $7 \times 10^{4 \circ}$ C.

COMPARATIVE EXAMPLE

As in the Experimental Example 1, an initial hafnium oxide layer was formed on a substrate. After the initial hafnium oxide layer was formed, a rapid heat treatment was performed with respect to the substrate thereby applying power thereto via laser spike annealing for 15 seconds as an elongated effective heating time at 450° C., 500° C., 550° C., 600° C., 650° C., 700° C., and 750° C.

Figure 7A:
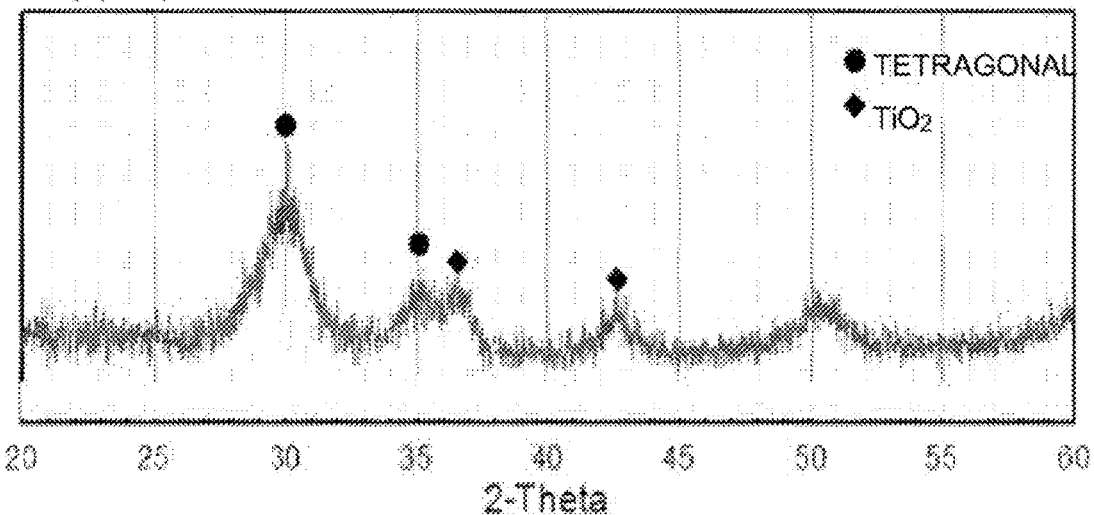
FIGS. 7A and 7B are X-ray diffraction graphs regarding hafnium oxide thin-films respectively fabricated in the Experimental Examples 1 and 2.
Figure 7B:
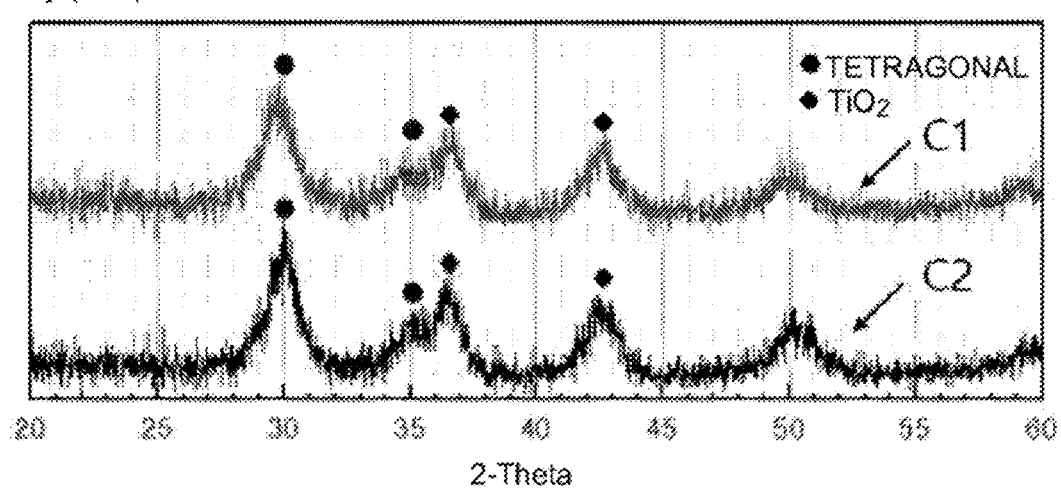
Figure 8:
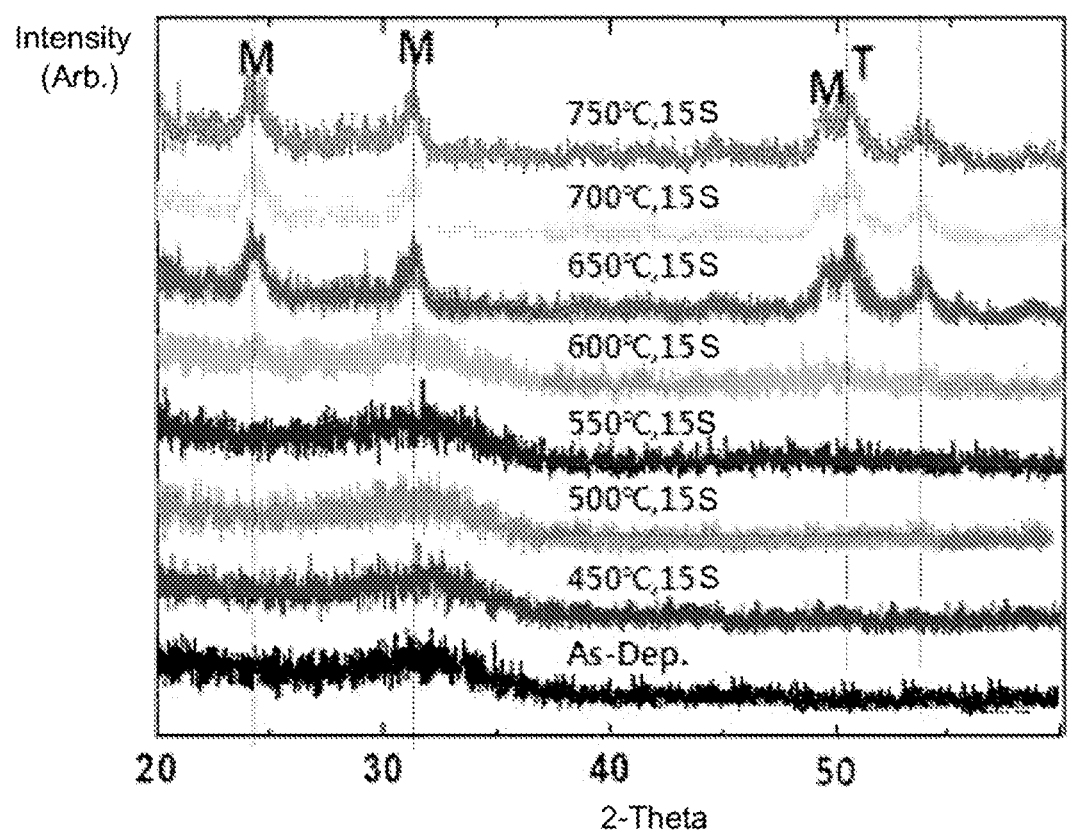
FIG. 8 is an X-ray diffraction graph illustrating a hafnium oxide thin-film fabricated in a comparative example.

FIGS. 7A and 7B are X-ray diffraction graphs regarding the hafnium oxide thin-films respectively fabricated in the Experimental Examples 1 and 2, and FIG. 8 is an X-ray diffraction graph regarding the hafnium oxide thin-film fabricated in the comparative example.

Referring to FIG. 7A, in the Experimental Example 1, a tetragonal hafnium oxide was detected, whereas no monoclinic hafnium oxide was detected. Referring to FIG. 7B, in the Experimental Example 2 employing a nucleation suppressing layer, an intensity of a tetragonal crystal structure at a peak further increased compared to the Experimental Example 1 (refer to the curve $C_1$, which is for the effective heating time of 0.18 μs). Even more, the tetragonal hafnium oxide was obtained at a delayed crystallization time, that is at 1.3 ms (refer to the curve $C_2$, which is for the effective heating time of 1.3 ms). Therefore, it was clear that the nucleation suppressing layer was effective to maintain the tetragonal crystal structure and widens a process window. Peaks of TiN shown in FIGS. 7A and 7B were obtained from TiN electrodes formed before the initial hafnium oxides were formed.

Referring to FIG. 8, a mixture of hafnium oxide having a tetragonal crystal structure and hafnium oxide having a monoclinic crystal structure is found at 650° C., 700° C., and 750° C., while only hafnium oxide having a monoclinic crystal structure was found at 550° C. and 600° C. The nose of a TTT curve is found between 550° C. and 750° C., and the nucleation of monoclinic hafnium oxide occurs when 10 ms elapsed since a rapid heat treatment starts. In FIG. 8, a rapid heat treatment was performed for 15 seconds. Thus, a crystal grain growth of the monoclinic hafnium oxide may occur, and the phase change to monoclinic hafnium oxide crystal structure may occur.

According to the above-stated embodiments, a tetragonal hafnium oxide layer may be obtained without an additional doping operation. Instead, the tetragonal hafnium oxide layer may be obtained by using an initial hafnium oxide layer as a starting material and thermodynamically controlling a crystallization process and a rapid cooling process. Furthermore, optionally, by forming a nucleation suppressing layer on the initial hafnium oxide layer, a process margin can increase. For example, a time window for a rapid cooling process can increase. Furthermore, according to an embodiment, a tetragonal hafnium oxide layer may be formed only by thermodynamically controlling a rapid cooling process without formation of a separate seed layer on or an impurity doping to an initial hafnium oxide layer, simplifying a manufacturing process and lowering a production cost.

A tetragonal hafnium oxide layer formed as described above exhibits a high dielectric permittivity equal to or higher than 60 and a wide band gap. The tetragonal hafnium oxide layer may be used to form a reliable capacitor and may also be applied to a device such as a gate insulation layer for a transistor. However, the above-stated devices are merely examples, and the present invention is not limited thereto. For example, the tetragonal hafnium oxide layer may not only be applied to a semiconductor device, but also to a sensor or an energy converting device.

According to embodiments, an initial hafnium oxide layer is used which has an amorphous crystal structure, a monoclinic crystal structure, or a mixed structure thereof as a starting material; the initial hafnium oxide layer is phase-changed to a tetragonal hafnium oxide layer at a temperature equal to or above a phase change temperature; and Martensite-like formation of a monoclinic crystal structure is suppressed by rapidly cooling the heated tetragonal hafnium oxide layer, thereby maintaining the tetragonal hafnium oxide layer at a meta-stable phase at a room temperature. As a result, a tetragonal hafnium oxide layer may be reliably fabricated without an additional process, such as a seed layer insertion or ion implantation. Furthermore, a nucleation suppressing layer is optionally formed on the initial hafnium oxide layer. The monoclinic crystal structure may be effectively suppressed and a time window for the rapid cooling process may be widened. As a result, a tetragonal hafnium oxide layer may be formed more easily.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for fabricating a tetragonal hafnium oxide layer, the method comprising:

forming an initial hafnium oxide layer over a substrate, wherein the initial hafnium oxide layer has an amorphous structure, a monoclinic crystal structure, or a mixed structure thereof;

phase-changing the initial hafnium oxide layer to a tetragonal hafnium oxide layer by heating the initial hafnium oxide layer to a phase change temperature; and rapid-cooling the tetragonal hafnium oxide layer to suppress a nucleation and growth of a monoclinic hafnium oxide from the tetragonal hafnium oxide layer, wherein the rapid-cooling of the tetragonal hafnium oxide layer is performed by a descending temperature time-temperature path, wherein the nucleation and growth of the monoclinic hafnium oxide has a Martensite-like transformation behavior, and the Martensite-like transformation behavior has a time-temperature-transformation curve of initiation of crystallization of a monoclinic hafnium oxide, and wherein the descending temperature time-temperature path is within a left outside region of the curve.

2. The method of claim 1, wherein the initial hafnium oxide layer is formed over the substrate by atomic layer deposition, chemical vapor deposition, physical vapor deposition, or a combination thereof.

3. The method of claim 1, wherein a thickness of the initial hafnium oxide layer is in a range between 20 Å and 200 Å.

4. The method of claim 1, wherein the phase-changing to the tetragonal hafnium oxide layer is performed by a rapid laser annealing process.

5. The method of claim 4, wherein the rapid laser annealing process is performed using a laser spike annealing process, a flash lamp annealing process, a diode laser annealing process, or a combination thereof.

6. The method of claim 1, wherein the rapid-cooling of the tetragonal hafnium oxide layer is performed by cooling the tetragonal hafnium oxide layer down to a temperature T2 for an elapsed time D2, and wherein a phase change based on a Martensite-like transformation of the monoclinic hafnium oxide does not occur during the rapid-cooling.

7. The method of claim 1, wherein the rapid-cooling starts at a first temperature X1 and at a first given time Y1 and completes at a second temperature X2 and at a second given time Y2, wherein the phase-changing of the initial hafnium oxide layer to the tetragonal hafnium oxide layer occurs at a third temperature X3 and at a third give time Y3, wherein Y3 is variable depending on X3 and a relation between X3 and Y3 is defined by a function Y3=f(X3), wherein Y1 is variable depending on X1 and Y2 is variable depending on X2, and wherein X1, Y1, X2, and Y2 are selected so that Y1<f(X1) and Y2<f(X2) are satisfied.

8. The method of claim 1, wherein the rapid-cooling is performed for 10 ms or less.

9. The method of claim 1, wherein the rapid-cooling is performed at a speed between $10^{3°}$ C./sec and $10^{6°}$ C./sec.

10. The method of claim 1, further comprising heating the rapidly cooled tetragonal hafnium oxide layer to a temperature T3, wherein a lowest temperature at which the phase-changing can occur is T4. and wherein the temperature T3 is lower than the temperature T4.

11. The method of claim 1, further comprising forming an additional layer over the tetragonal hafnium oxide layer, and wherein the additional layer includes a silicon oxide ($SiO_2$) layer, a silicon nitride (SiN) layer, a zirconium oxide ($ZrO_2$) layer, a tantalum oxide ($Ta_2O-5$) layer, a titanium oxide ($TiO_2$) layer, an aluminum oxide ($Al_2O_3$) layer, lanthanum oxide ($La_2O_3$) layer, an yttrium oxide ($Y_2O_3$) layer, a zirconium oxide ($ZrO_2$) layer, a strontium titanium oxide ($SrTiO_3$) layer, a zirconium silicon oxide ($ZrSiO_4$) layer, a hafnium zirconium oxide ($HfZrO_4$) layer, a strontium bismuth tantalum oxide ($SrBi_2Ta_2O_9$, SBT) layer, a lead zirconium titanium oxide ($PbZr_xTi_{1-x}O_3$, PZT) layer, barium strontium titanium oxide ($Ba_xSr_{1-x}TiO_3$, BST) layer, or a stacked structure thereof.

12. A method for fabricating a tetragonal hafnium oxide layer, the method comprising:

forming an initial hafnium oxide layer over a substrate, wherein the initial hafnium oxide layer has an amorphous structure, a monoclinic crystal structure, or a mixed structure thereof;

heat-treating the initial hafnium oxide layer at a temperature T1, wherein the temperature T1 is lower than a phase change temperature;

phase-changing the initial hafnium oxide layer to a tetragonal hafnium oxide layer by heating the initial hafnium oxide layer to the phase change temperature;

rapid-cooling the tetragonal hafnium oxide layer to suppress a nucleation and growth of a monoclinic hafnium oxide from the tetragonal hafnium oxide.

13. A method for fabricating a tetragonal hafnium oxide layer, the method comprising:

forming an initial hafnium oxide layer over a substrate, wherein the initial hafnium oxide layer has an amorphous structure, a monoclinic crystal structure, or a mixed structure thereof;

phase-changing the initial hafnium oxide layer to a tetragonal hafnium oxide layer by heating the initial hafnium oxide layer to a phase change temperature: and rapid-cooling the tetragonal hafnium oxide layer to suppress a nucleation and growth of a monoclinic hafnium oxide from the tetragonal hafnium oxide layer, wherein the phase-changing of the initial hafnium oxide layer to the tetragonal hafnium oxide layer is performed by heating the initial hafnium oxide layer at a speed S1 for an effective heating time D1, wherein the speed S1 is in a range between 150° C./sec and 5×108° C./sec, and wherein the effective heating time period D1 is between 0.05 μs and 2×104 μs.

14. The method of claim 13, wherein the phase change temperature is between 800° C. and 1,600 ° C. during the effective heating time.

15. The method of claim 13, wherein the phase-changing is performed in an inert gas atmosphere.

16. A method for fabricating a tetragonal hafnium oxide layer, the method comprising:

forming an initial hafnium oxide layer over a substrate, wherein the initial hafnium oxide layer has an amorphous structure, a monoclinic crystal structure, or a mixed structure thereof;

forming a nucleation suppressing layer over the initial hafnium oxide layer;

phase-changing the initial hafnium oxide layer to a tetragonal hafnium oxide layer by heating the initial hafnium oxide layer to a phase change temperature; and rapid-cooling the tetragonal hafnium oxide layer to suppress a nucleation and growth of a monoclinic hafnium oxide from the tetragonal hafnium oxide layer based on the nucleation suppressing layer.

17. The method of claim 16, wherein the nucleation suppressing layer restricts a volume expansion due to the change of the tetragonal hafnium oxide layer into the monoclinic hafnium oxide.

18. The method of claim 16, wherein the nucleation suppressing includes a titanium nitride (TiN), a tantalum nitride (TaN), titanium aluminum nitride (TiAlN), titanium silicon nitride (TiSiN), tantalum carbonate (TaC), zirconium nitride (ZrN), hafnium nitride (HfN), ruthenium (Ru), or a stacked structure thereof.

19. The method of claim 16, wherein the nucleation suppressing layer comprises an aluminum oxide, a zirconium oxide, a tantalum oxide, or a titanium oxide.

20. The method of claim 16, wherein the nucleation suppressing layer is doped with aluminum or silicon.

21. The method of claim 20, wherein a doping concentration of the aluminum or the silicon in the nucleation suppressing layer is within a range between 0.05 weight % and 5weight % with respect to a total weight of the nucleation suppressing layer.

22. A method of fabricating a semiconductor device, the method comprising:

providing a substrate;

forming an initial hafnium oxide layer over the substrate, wherein the initial hafnium oxide layer has an amorphous structure, a monoclinic crystal structure, or a mixed structure thereof;

phase-changing the initial hafnium oxide layer to a tetragonal hafnium oxide layer by heating the initial hafnium oxide layer at a temperature equal to or higher than a phase change temperature of the tetragonal hafnium oxide layer;

rapid-cooling the heated tetragonal hafnium oxide layer to suppress a nucleation and growth of a monoclinic hafnium oxide from the tetragonal hafnium oxide layer; and forming an electrode or a semiconductor layer over the tetragonal hafnium oxide layer, wherein the rapid-cooling of the tetragonal hafnium oxide layer is performed by a descending temperature time-temperature path, wherein the nucleation and growth of the monoclinic hafnium oxide has a Martensite-like transformation behavior, and the Martensite-like transformation behavior has a time-temperature-transformation curve of initiation of crystallization of a monoclinic hafnium oxide, and wherein the descending temperature time-temperature path is within a left outside region of the curve.

23. The method of claim 22, wherein the tetragonal hafnium oxide layer serves as a dielectric of a capacitor or a gate insulation layer.

24. A method of fabricating a semiconductor device, the method comprising:

providing a substrate;

forming an initial hafnium oxide layer over the substrate, wherein the initial hafnium oxide layer has an amorphous structure, a monoclinic crystal structure, or a mixed structure thereof;

forming a nucleation suppressing layer over the initial hafnium oxide layer;

phase-changing the initial hafnium oxide layer to a tetragonal hafnium oxide layer by heating the initial hafnium oxide layer at a temperature equal to or higher than a phase change temperature of the tetragonal hafnium oxide layer;

rapid-cooling the heated tetragonal hafnium oxide layer to suppress a nucleation and growth of a monoclinic hafnium oxide from the tetragonal hafnium oxide layer based on the nucleation suppressing layer; and forming an electrode or a semiconductor layer over the tetragonal hafnium oxide layer.

* * * * *